United States Patent [19]

Suzuki et al.

[11] Patent Number: 4,952,970

[45] Date of Patent: Aug. 28, 1990

[54] AUTOFOCUSING SYSTEM FOR A PROJECTING EXPOSURE APPARATUS

[75] Inventors: Akiyoshi Suzuki, Tokyo; Haruna Kawashima, Kawasaki, both of Japan

[73] Assignee: Canon Kabushiki Kaisha, Tokyo, Japan

[21] Appl. No.: 427,891

[22] Filed: Oct. 17, 1989

Related U.S. Application Data

[63] Continuation of Ser. No. 323,213, Mar. 16, 1989, abandoned, which is a continuation of Ser. No. 165,475, Mar. 8, 1988, abandoned.

[30] Foreign Application Priority Data

Mar. 10, 1987 [JP] Japan ................. 62-53042

[51] Int. Cl.$^5$ .............. G03B 27/52; G03B 27/70; G03B 27/32
[52] U.S. Cl. ........................ 355/43; 355/53; 355/55; 355/77
[58] Field of Search ............ 355/43, 53, 55–57, 355/77; 356/138, 141, 399, 400; 353/100, 101, 121, 122; 250/548; 29/569.1

[56] References Cited

U.S. PATENT DOCUMENTS

| | | | |
|---|---|---|---|
| 4,127,777 | 11/1978 | Binder | 250/548 |
| 4,395,117 | 7/1983 | Suzuki | 355/43 |
| 4,441,250 | 4/1984 | Imahasi | 29/569.1 |
| 4,615,614 | 10/1986 | Sugiyama | 355/55 X |
| 4,657,379 | 4/1987 | Suwa | 355/43 X |
| 4,666,273 | 5/1987 | Shimizu et al. | 355/55 X |
| 4,668,077 | 5/1987 | Tanaka | 355/43 |
| 4,687,322 | 8/1987 | Tanimoto et al. | 355/43 X |
| 4,801,977 | 1/1989 | Ishizaka et al. | 355/53 |
| 4,814,829 | 3/1989 | Kosugi et al. | 355/43 |
| 4,829,193 | 5/1989 | Nishi | 250/548 |

FOREIGN PATENT DOCUMENTS

| | | |
|---|---|---|
| 140418 | 6/1987 | Japan . |
| 281422 | 12/1987 | Japan . |
| 291919 | 12/1987 | Japan . |
| 293718 | 12/1987 | Japan . |
| 63-7626 | 1/1988 | Japan . |

Primary Examiner—Richard A. Wintercorn
Attorney, Agent, or Firm—Fitzpatrick, Cella, Harper & Scinto

[57] ABSTRACT

An autofocusing system, usable with a projection optical system for projecting a pattern of a first object upon a second object, for positioning the surface of the second object with respect to an imaging plane of the projection optical system is disclosed, wherein the surface of the second object is illuminated; wherein an image of the second object is formed on a predetermined plane by use of the projection optical system; and wherein the interval between the imaging plane of the projection optical system and the surface of the second object with respect to the direction of an optical axis of the projection optical system is adjusted on the basis of the state of the image of the second object formed on the predetermined plane, such that the surface of the second object can be positioned on the imaging plane of the projection optical system.

30 Claims, 7 Drawing Sheets

AUTOFOCUSING SYSTEM FOR A PROJECTING EXPOSURE APPARATUS

This application is a continuation of application Ser. No. 323,213 filed Mar. 16, 1989, which is a continuation of application Ser. No. 165,475 filed Mar. 8, 1988, both prior applications abaondoned.

FIELD OF THE INVENTION AND RELATED ART

This invention relates to an autofocusing system for accurately positioning an article upon an imaging plane of an optical projection system. More particularly, the invention is concerned with an autofocusing system for accurately adjusting, with respect to an imaging plane of a projection optical system, the position of an article having a transparent surface film. The autofocusing system of the present invention is particularly suitably usable in a projection exposure apparatus, such as a step-and-repeat type exposure apparatus, for projecting an image of a pattern of a reticle upon a wafer having a transparent photoresist surface layer and being disposed on an imaging plane of a projection optical system by which the reticle image is being projected.

Basic performances required for an exposure apparatus for use in the manufacture of semiconductor microcircuits are the resolution, the superimposing accuracy and the throughput. Of these fundamental characteristics, the resolution is particularly important in respect to ensuring manufacture of larger-capacity microcircuits since the resolution determines the limit of fineness of a linewidth that can be reproduced by the exposure apparatus.

Particularly, in the field of projection type exposure apparatuses such as step-and-repeat reduction projection exposure apparatuses, many efforts have been made to increase the numerical aperture (NA) of a projection lens system and to use light of shorter wavelength, both for the purpose of improving the resolution. However, as a result of these endeavors, the depth of focus of the projection lens system is made quite small such that a slight change in the ambient pressure or the absorption of light by the projection lens system itself causes shift of the focus position to an extent that cannot be disregarded. Accordingly, development of a focus control system that can operate following such shift of the focus position of a projection lens system is desired.

Generally, two types of focus control systems have been proposed and used. One is a type which uses air-microsensors. The other is a type which uses an optical arrangement utilizing a light, such as, for example, disclosed in Japanese Laid-Open Patent Applications, Laid-Open No. Sho 62-140418 and Sho 63-7626 both filed in Japan in the name of the assignee of the subject application. In either type, the focus position of a projection optical system is detected without intervention of the projection optical system itself. As for the shift of the focus position described hereinbefore, usually, the ambient pressure is monitored and the amount of shift of the focus position corresponding to the change in the ambient pressure is calculated, the resultant data being treated as an "offset". With regard to the shift of the focus position of the projection lens system resulting from the absorption of light, usually the focus control is made without calibration in this respect, since the focus position does not change by so large an amount due to the light absorption.

Namely, in the described types of focus control systems, it is the only possible way to compensate for the change in the focus position as an "offset" on the basis of indirect detection of the shift of the focus position (i.e. by monitoring the change in the pressure, temperature and so on and determining the focus shift by calculation). With this method, however, sensors are indispensable to detect, indirectly, the change in the focus position. Thus, the detecting precision of the sensor means affects the focus controlling accuracy. Further, the sensor means can produce only indirect information. Accordingly, there is a large possibility that the sensor output does not exactly reflect the change in the focus position of the projection optical system (i.e. the position of the imaging plane).

As described, there are many factors of error within relation to the detection of the exact focus position by the focus control systems of the aforementioned types.

The inconveniences involved in the indirect focus detection system described above may be avoided by a "TTL (Through-The-Lens)" focus control system such as disclosed in U.S. Pat. No. 4,395,117 assigned to the same assignee of the subject application. In the proposed focus control system, a pair of light fluxes are extracted out of an imaging light passing a projection optical system and the extracted lights are projected upon a wafer inclinedly. The lights specularly reflected from the wafer surface are received at a mask side and, on the basis of the imaging position of the reflected lights from the wafer, the focus position of the projection optical system relative to the wafer surface is determined.

SUMMARY OF THE INVENTION

It is an object of the present invention to provide a novel and unique autofocusing system by which an article can be positioned with high accuracy with respect to an imaging plane of a projection optical system.

Briefly, in accordance with an aspect of the present invention, to achieve the above object, there is provided an autofocusing system, usable with a projection optical system for projecting a pattern of a first object upon a second object, for positioning the surface of the second object with respect to an imaging plane of the projection optical system: wherein the surface of the second object is illuminated; wherein an image of the second object is formed on a predetermined plane by use of the projection optical system; and wherein the interval between the imaging plane of the projection optical system and the surface of the second object with respect to the direction of an optical axis of the projection optical system is adjusted on the basis of the state of the image of the second object formed on the predetermined plane, such that the surface of the second object can be positioned on the imaging plane of the projection optical system.

In another aspect of the present invention which will be described later, there is provided an autofocusing system for use in a projection exposure apparatus for projecting an image of a first object upon a second object, which system includes: illumination means for illuminating a mark formed on the second object; an optical arrangement effective to form, by use of the projection optical system, an image of the mark illuminated by the illumination means; discriminating means operable to discriminate the positional relation between the second object and an imaging plane of the projection optical system on the basis of the state of the image of the mark formed by the cooperation of the projection optical system and the optical arrangement; and adjusting means operable to position the second object upon the imaging plane on the basis of the discrimination by the discriminating means.

In one preferred form of the present invention, the illumination means includes a light source which is adapted to supply a light, preferably a laser beam, having a wavelength different from that of a light used for the projection exposure of the second object. The illumination means projects such light directly and inclinedly upon the mark of the second object not by way of the projection optical system. The light scattered by the edge of the mark is selectively received by the projection optical system, and the optical arrangement then functions to form an image of the mark (the edge thereof) with the aid of the projection optical system. The optical arrangement includes optical means effective to correct any chromatic aberration. Thus, the mark of the second object, or the edge thereof, can be imaged very sharply.

In accordance with a further aspect of the present invention, as will be described later, a TTL (Through-The-Lens) focus control system is provided wherein a light is projected upon a wafer having a photoresist surface layer formed on a base or substrate and wherein the light reflected from the surface of the photoresist layer and the light reflected from the surface of the substrate of the wafer are separated. With this structure, undesirable interference between these lights and undesirable deterioration of the detection accuracy resulting therefrom are prevented. As a result, the focus control system can maintain a reticle and a wafer exactly and stably in an imaging relation with each other regardless of any change in the focus of a projection optical system.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Briefly, the autofocusing system of the present invention is arranged to detect any positional deviation of the surface of an article form an imaging plane of a projection optical system by using the projection optical system and to bring the surface of the article and the imaging plane of the projection optical system into coincidence with each other in accordance with the detection. Thus, the autofocusing system of the present invention provides a TTL focus control system.

Figure 1:
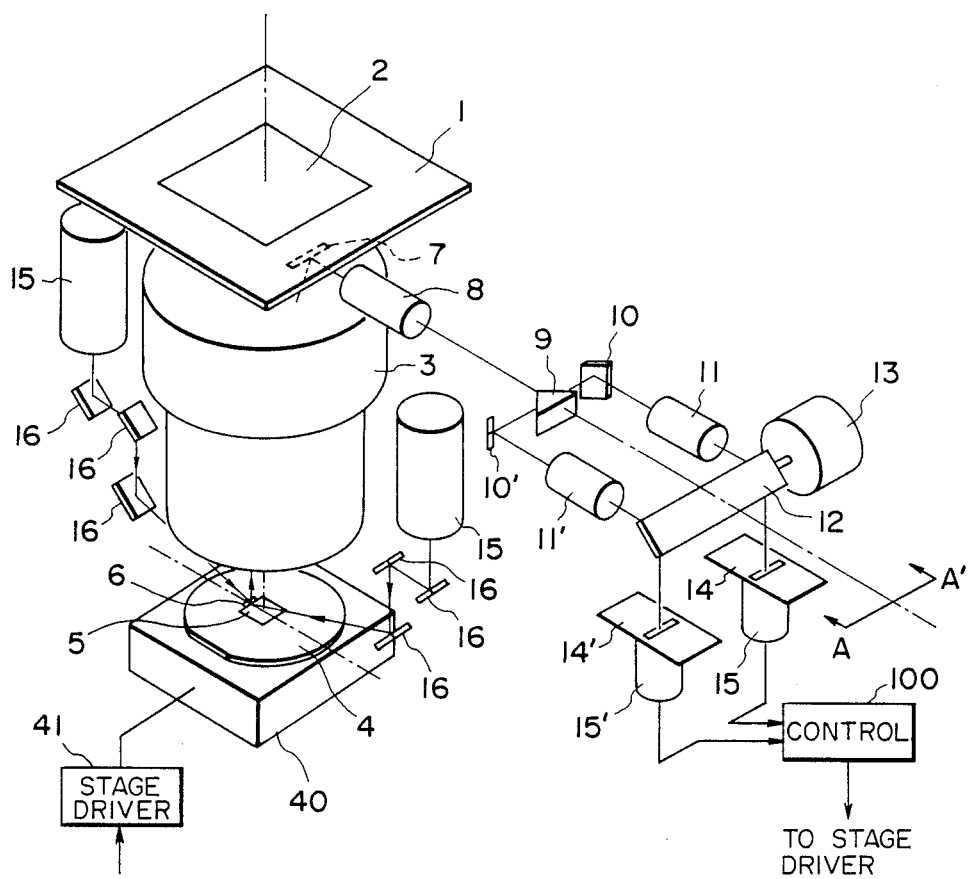
FIG. 1 is a schematic and diagrammatic view of an exposure apparatus into which an autofocusing system according to one embodiment of the present invention is incorporated.

Referring first to FIG. 1, there is shown an autofocusing system according to a first embodiment of the present invention. In this embodiment, the autofocusing system is incorporated into a reduction projection exposure apparatus, called a "stepper".

In FIG. 1, projection lens system 3 is adapted to project a circuit pattern 2 of a reticle 1 upon a wafer 4 to expose the same. The projection lens system 3 may be arranged, as usual, so that it is telecentric on the wafer 4 side in order to prevent that the distortion characteristics and the magnification of the projection lens system do not change as a result of any surface unevenness of the wafer 4 which is a workpiece to be processed, any change in focus due to errors in the focus detection or focusing drive made by focus control system, or for any other reason. In the FIG. 1 embodiment, the circuit pattern 2 (or image thereof) of the reticle 1 can be projected at a time upon one region (hereinafter "shot area") of the wafer 4, as denoted at reference numeral 5, in a reduced scale.

The wafer 4 is placed on a wafer stage 40 which is movable, under the influence of a stage driver 41, along the optical axis of the projection lens system 3 and also in a plane orthogonal to the optical axis of the projection lens system. Thus, the wafer 4 can be displaced in each of these directions, relative to the image of the circuit pattern of the reticle 1 as formed on the imaging plane of the projection lens system 3.

In the present embodiment, at least one focus detection mark such as denoted at 6 in FIG. 1 is provided on a wafer 4, and the autofocusing system includes an optical illumination arrangement which is effective to project a light directly and inclinedly upon the mark 6 such that the light reflected from the mark is used and detected for the focus controlling purpose.

Each wafer may be provided with only one focus detection mark or, alternatively, it may be provided with plural such marks in relation to the shot areas thereof. In the latter case, each mark may preferably be formed on a scribe line between adjacent shot areas.

In FIG. 1, the mark 6 of a particular shot area, which is going to be exposed to the reticle pattern, is illuminated inclinedly, as illustrated, by means of components (denoted by numerals 15 and 16) of the illumination system which are disposed substantially between the reticle 1 and the wafer 4 with respect to the direction of the optical axis of the projection lens system. Details of the arrangement of the FIG. 1 embodiment will be described later.

In this embodiment, the illumination system uses light of a wavelength which is different from that of light used for the projection exposure (photoprinting). It has been found that, where a monochromatic light such as a laser beam, as having a wavelength different from that of the light used for the exposure, is used for the focus detection purpose, the most important factor which causes an error in the detection of a focus signal is the interference between the light as reflected by the surface of a resist coating of a wafer and the light as passed through the resist coating and then reflected by the surface of a base or substrate of the wafer. While the effect of such interference may be removed in some ways, the most fundamental solution is to extinguish or exclude one of the two lights.

The results of observation of the state of resist coatings on the surfaces of wafers by use of a scan type electron microscope (SEM) or an interference microscope have shown that, even for a wafer having a very large surface step (recess/protrusion), the angle of inclination of the surface of the resist material covering such surface step is, at the maximum, of an order of 5 degrees, or more or less, and that there is little possibility of existence of a more steep slope. From the viewpoint of step coverage, usually a wafer having a large surface step is coated with a resist layer of a thickness greater than the size (depth or height) of the step (recess/protrusion). For this reason, the surface inclination is held approximately on an order of 5 degrees, more or less.

Figure 2:
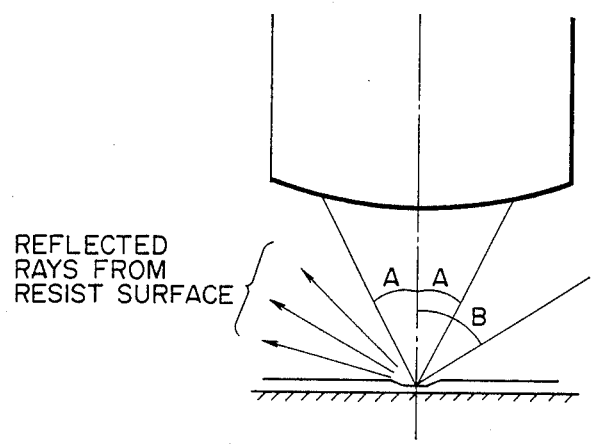
FIG. 2 is a schematic illustration for explicating the separation of a light component reflected by a wafer and to be detected by a projection optical system, from a light component reflected from the surface of a resist coating of the wafer.

In the autofocusing system of the present embodiment, in consideration of this, the mark 6 of the wafer is illuminated by use of light which is conditioned so as to satisfy the following relation:

$$A + 10° \leq B \quad (1)$$

wherein A is the maximum detection angle which the detection optical system shows with respect to the detection of the wafer, as illustrated in FIG. 2, and B is the angle of incidence of the illumination light being projected upon the wafer, i.e. the angle of inclination defined with respect to the optical axis of the projection optical system.

When the condition (1) is satisfied, the components of the wafer illuminating light as reflected by the surface of the resist layer on the wafer do not enter into the detection optical system but go outwardly of the detection optical system, as is seen in FIG. 2. Thus, only the components of the light as passed through the resist layer and reflected back from the wafer substrate can be received by the detection optical system. In the embodiment shown in FIG. 1, the term "detection optical system" is used to refer to the whole optical arrangement including the projection lens system 3, a focus detecting optical system (having elements denoted at numerals 8–11), a photoelectric converting means 14 such as a photomultiplier and some other elements, all of which are contributable to observe the wafer.

The maximum angle A which the detection optical system possesses with respect to the wafer 4 agrees with a value determined by the numerical aperture (NA) of the projection lens system 3, unless a special stop member is inserted into the focus detecting optical system (8–11) so as to restrict the numerical aperture of the projection lens system 3. Namely, if NA=0.35, then the angle $A = \sin^{-1} 0.35 = 20.49°$. Therefore, the angle B of the incidence to be defined by the illumination system has to be not less than 30.49°. If a stop member is provided on the detection optical system side so that the numerical aperture of the projection lens system is restricted, the value A becomes less than the value determined by the NA.

Conventional optical focus control systems having been proposed for use in a stepper are arranged so that the light having been reflected by a wafer at an angle the same as the angle (B) of incidence of the illumination light upon the wafer, is used and detected by a detection lens for the focus control purpose. According to the present embodiment, as compared therewith, the wafer 4 is illuminated by use of light supplied from outside of the projection lens system 3 (which functions also as a detecting lens for the focus control). Additionally, a specific limitation "10°" is set, as described hereinbefore. With this arrangement, the light reflected from the surface of the resist layer can be excluded.

It should be noted that the capability of separately extracting the light scatteringly or diffractively reflected from the wafer substrate which is on the bottom of the resist layer, independently of the light reflected by the surface of the resist layer, directly leads to enhanced focus detection accuracy. It is to be added that in the present embodiment, such light to which the resist material is substantially insensitive is used for the illumination of the mark 6, in order to prevent accidental damage of an actual element pattern (circuit pattern) on the wafer due to the waveguide effect of the resist thin film layer.

The illumination system of the autofocusing system according to the FIG. 1 embodiment uses two lasers 15 which produce laser beams whose wavelengths are different from that of the light used for the "exposure", i.e. photoprinting. These laser beams are directed by means of mirrors 16 to illuminate, at one time, the same focus detection mark 6 provided on the wafer 4. Another feature of the illumination system of the FIGS. 1 embodiment is that the illumination lights are projected upon the mark 6 in the directions which are predetermined in accordance with the directionality of the mark 6 which is also predetermined. Preferably, the illumination lights are projected in the directions which are substantially orthogonal to the lengthwise edge or edges of the mark.

The state of focus can be detected in two ways. One is to use a pair of lens systems having eccentric stops disposed on respective pupil planes. In this method, the state of focus or "best focus" can be detected on the basis of relative positional deviation between the images of the mark 6 formed on respective image planes of the paired lens systems. The other way is to determine the state of focus or "best focus" on the basis of contrast of the images of the mark 6 formed on respective image planes of paired lens systems.

Figure 3:
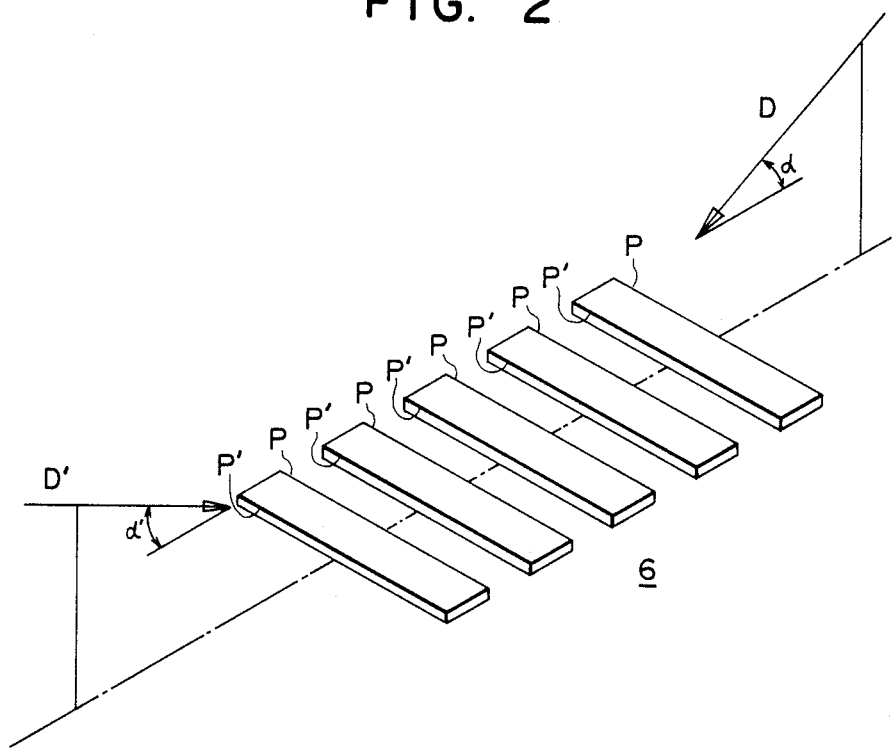
FIG. 3 is a schematic view showing the direction of projection of light, for illuminating a focus detection mark comprising a plurality of linear patterns.

The FIG. 1 embodiment is a case wherein the former is used. An example of a mark usable as the focus detection mark 6 on the wafer 4 is illustrated in FIG. 3. In the FIG. 3 example, the mark 6 comprises a plurality of mark elements each being formed by an elongated pattern having two elongated edges P and P'. In this example, as denoted by an arrow D or D', each of the two illumination lights is projected upon the mark 6 in a direction which is substantially orthogonal to the lengthwise edge P or P' of each mark element pattern of the mark 6 and with an angle $\alpha$ or $\alpha'$ with respect to the surface of the wafer 4.

The light scattered and reflected by the edge P or P' of each mark element pattern enters into the projection lens system 3 which functions as a detection lens at this time. The light emanating from the projection lens system 3 is then reflected by a common mirror 7 toward a correcting optical system 8. The light from the correcting optical system 8 is imaged at the position of a roof prism 9 or in the neighborhood thereof. Thus, images of the edges P and P' of the mark element patterns are formed at this position or in the vicinity thereof.

By this roof prism 9, the image of each mark pattern edge P or P' is divided into two with respect to the lengthwise direction thereof, as will be described later. Each of the thus split lights is reflected by a corresponding one of two mirrors 10 and 10' and enters into a corresponding one of two imaging lenses 11 and 11'. These imaging lenses have eccentric stops each having an aperture which is eccentric with respect to an optical axis and being disposed on a pupil plane of the corresponding imaging lens, which plane is optically conjugate with the pupil plane of the projection lens system 3.

After passing through the imaging lenses 11 and 11', the lights are reflected by a common galvano mirror 12 toward slit plates 14 and 14', respectively, such that a split image, i.e. a half (half length) of the image of each mark pattern edge P or P', is formed on each split plate 14 or 14', as will be described later with reference to FIG. 5.

Figure 4:
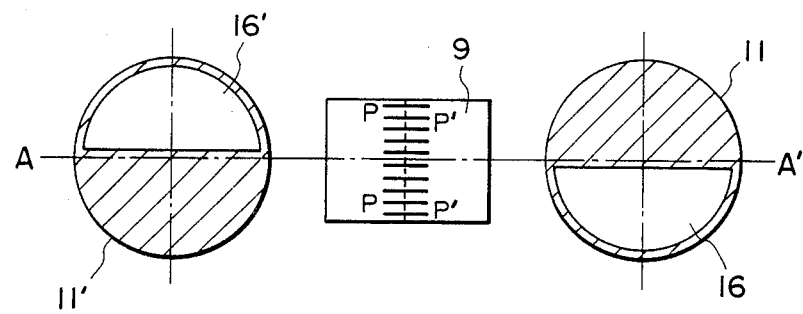
FIG. 4 is a schematic view of eccentric stop members disposed respectively at pupils of imaging lenses included in a detection optical system of the FIG. 1 embodiment.

The interrelation of the two eccentric stops disposed on the pupil planes of the imaging lenses 11 and 11' is schematically illustrated in FIG. 4. Also shown in FIG. 4 are the images of the mark pattern edges P and P' which are formed at the position of the roof prism 9, the images and the two stops being illustrated as they are viewed in the directions of arrows A and A in FIG. 1.

As seen in FIG. 4, the eccentric stops have semi-circular apertures 16 and 16' each being eccentrically formed with respect to the optical axis of the corresponding imaging lens 11 or 11', or, in other words, with respect to the vertical direction as viewed in FIG. 4. Further, these apertures 16 and 16' of the two stops are defined symmetrically in the vertical direction as illustrated.

Now, description will be made of a case where the mark 4 of the wafer is observed at the planes of the slit plates 14 and 14' by use of the imaging lenses 11 and 11' having the eccentric stops. The slit plates 14 and 14' are disposed so that each is exactly in an optically conjugate relation with the surface of the wafer 4 when the latter is exactly at the best focus position of the projection lens system 3.

Figure 5:
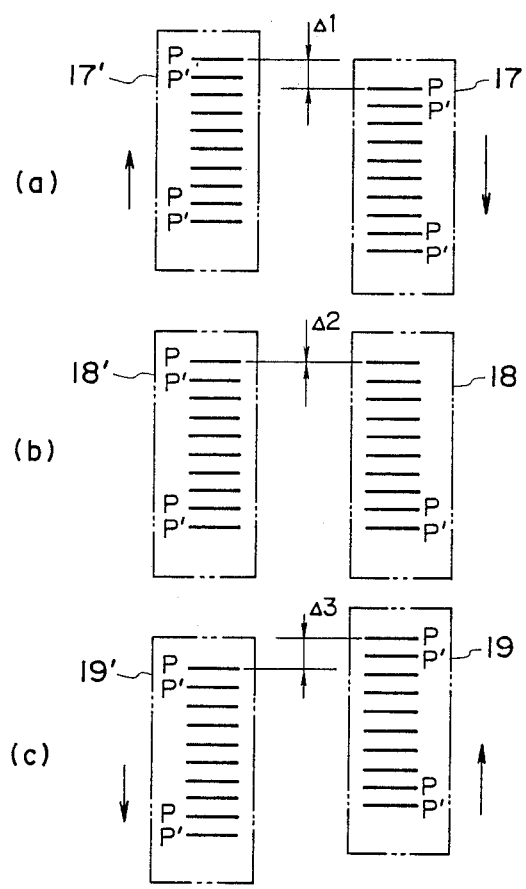
FIG. 5 is a schematic view showing examples of images of a focus detection mark, as can be observed at an image plane, when the mark is illuminated in the manner shown in FIG. 3.

The middle part (b) of FIG. 5 shows split images 18 and 18' of the mark pattern edges P and P', being formed on the slit plates 14 and 14', respectively, on an occasion that the mark 6 of the wafer 4 is at a best-focus or in-focus position with respect to the projection lens system 3. If the mark 6 is in this state, i.e. if it is at the in-focus position with respect to the projection lens system 3, there occurs no relative positional deviation between the split images 18 and 18' of the mark pattern edges Namely, $\Delta_2 = 0$.

If, on the other hand, the wafer 4 deviates from such best-focus or in-focus position in the direction of the optical axis of the projection lens system 3, the relation shown in the middle part (b) of FIG. 5 is broken. This will be described in detail.

It is well known that, when an image formed by an optical system having an eccentric stop disposed at its pupil plane is observed and if an object being examined is displaced in the direction of the optical axis of the optical system, the image being observed shifts or displaces in the direction with respect to which the aperture of the stop is eccentric.

Namely, if in the device of FIG. 1 the wafer 4 is at a site which is deviated from the best-focus position of the projection lens system 3 in the direction away from the projection lens system 3, that is if the wafer 4 is too remote from the projection lens system 3, then the split images of the mark pattern edges P and P' as can be observed shift relatively such as illustrated in the upper part (a) of FIG. 5, wherein the images are denoted at 17 and 17'. As seen in this part of FIG. 5, the split images 17 and 17' of the mark pattern edges are relatively deviated as denoted by arrows and by a corresponding amount $\Delta_1$.

If, on the other hand, the wafer 4 is at a site which is deviated from the best-focus position of the projection lens system 3 in the direction toward the projection lens system 3, that is the wafer 4 is too close to the projection lens system 3, then the split images of the mark pattern edges P and P' as can be observed shift relatively such as shown in the bottom part (c) of FIG. 5, wherein the images are denoted at 19 and 19'. As seen in this part of FIG. 5, the split images 19 and 19' are relatively deviated, as denoted by arrows, in a direction opposite to that of the case of the upper part (a) and by a corresponding amount $\Delta_3$.

By detecting the relative positional deviation $\Delta_1 - \Delta_3$ between the split images of the mark pattern edges, it is possible to maintain the wafer 4 at the best-focus position with respect to the projection lens system 3.

In the FIG. 1 embodiment, to assure detection of the relative positional deviation, namely $\Delta_1 - \Delta_3$, the lights emanating from the imaging lenses 11 and 11' are reflected by the galvano mirror 12 which is being swingingly moved by a motor 13. This causes the images of the mark 6 of the wafer 4 to be relatively scanned by slit apertures of the slit plates 14 and 14', respectively.

As seen from FIG. 5, these slit plates 14 and 14' have slit apertures each being formed to extend in a direction parallel to or corresponding to the images (denoted at P and P') of the edges of the mark 6. The light passed through the slit plate 14 or 14' is directed to a corresponding one of photomultipliers (PMT) 15 and 15'. In response to the reception of light, each photomultiplier can produce electric pulses of the number corresponding to the edges of the mark element patterns of the mark 6. Thus, by displacing the wafer 4 in the direction of the optical axis of the projection lens system 3 so that the photomultipliers 15 and 15' produce the same pulse signal train with respect to time, it is possible to bring the wafer 4 to the best-focus position with respect to the projection lens system 3.

In the present embodiment, the signal trains from the photomultipliers 15 and 15' are applied to a control 100 by way of respective signal lines and, in response to control signals from the control 100, the stage driver 41 is actuated to displace the wafer stage 40 in the direction of the optical axis of the projection lens system 3, such that the wafer 4 can be positioned exactly at the best-focus position of the projection lens system 3.

From the principle, the focus detection mark 6 may be provided by a single edge. However, in the FIG. 1 embodiment, the mark 6 has a number of edges as is best seen in FIG. 3. This is preferable since the detection accuracy can be improved as a result of the averaging effect.

The correcting optical system 8 shown in FIG. 1 is provided to correct chromatic aberration which is caused by the projection lens system 3. It may be formed by a plurality of parallel flat plates or lens elements, such as disclosed in Japanese Laid-Open patent applications, Laid-Open Nos. Sho 62-281422 and Sho 62-293718, for example. The manner of correction of the chromatic aberration caused by the projection lens system 3 is described in detail in the aforementioned Japanese Laid-Open patent applications The use of such a correcting optical system 8 is effective to ensure that the focus detection mark 6 is imaged very sharply irrespective that the mark is illuminated by use of a light having a wavelength different from that of the light used for the exposure and that the mark is imaged by way of the projection lens system 3.

In the FIG. 1 embodiment, the mark 6 is irradiated with lights projected in two directions. This is adopted in consideration of the possibility that, if the mark is illuminated only in one direction, there occurs a notable difference in the quantity between the lights passed through the stops 16 and 16' (FIGS. 4), which difference easily results in significant deterioration of the focus detecting accuracy. Thus, it will be particularly preferable to illuminate the mark in two symmetrical directions (wherein $\alpha=\alpha'$) so that substantially the same quantity of lights are obtainable from the stops 16 and 16'. By doing so, the photomultipliers 15 and 15' can produce photoelectric outputs of substantially the same level, with the advantage that high detection accuracy is attained.

If, nevertheless, it is desired to employ one-direction illumination, the signal obtained from the light image of less intensity as formed by the light passed through one of the stops 16 and 16' may be applied to an amplifier so that the level of such signal can be amplified. By suitably arranging the signal processing system in this manner or in any other way, the focus detecting accuracy may be retained.

In any case, the illumination of a mark of a wafer in the specific manner described hereinbefore assures that a bright image of the mark is observed substantially without the effect of the reflection of light at the surface of a resist layer and, thus, with a good signal-to-noise ratio even when a monochromatic light is used for the illumination and observation.

Referring back to FIG. 1, the focus detection mark 6 of the wafer 4 as illuminated in the manner described hereinbefore is once imaged at the position of the roof prism 9 or in the neighborhood thereof, with the aid of the correcting optical system 8. Then, it is re-imaged at the position of the slit plates 14 and 14' as the "split images". Thus, the state of focus of the projection lens system 3 with respect to the wafer 4 can be determined as described hereinbefore.

The operation following the completion of the focus adjustment may be made in accordance with any one of well-known sequences. For example, the autofocusing may be followed by moving the wafer by a predetermined distance to bring the same to the exposure station. The correcting optical system 8 may be retracted out of the path of light used for the exposure, if necessary.

Figure 6:
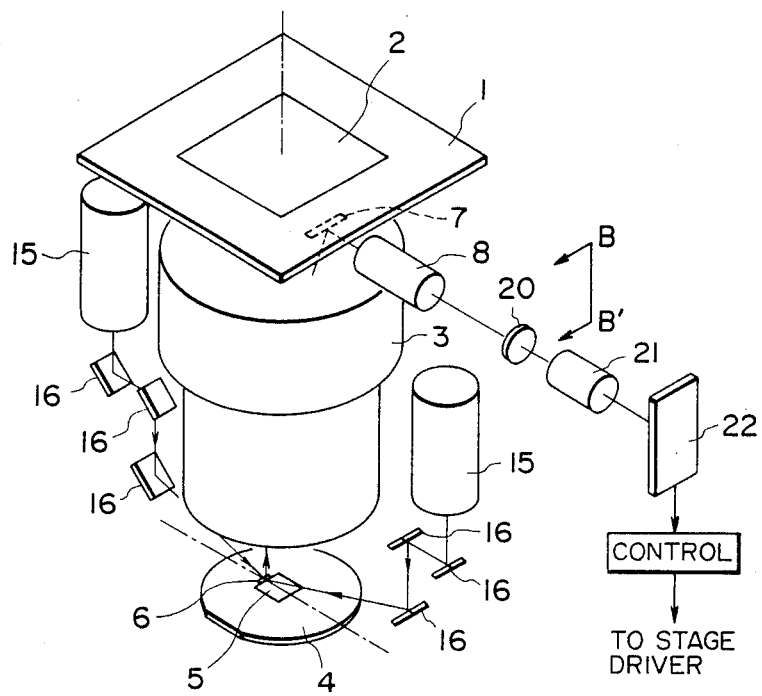
FIG. 6 is a schematic and diagrammatic view of an exposure apparatus into which an autofocusing system according to another embodiment of the present invention is incorporated.
Figure 7:
FIG. 7 is a side view of a split-image prism used in the FIG. 6 embodiment.

FIG. 6 shows another embodiment of the present invention, wherein the optical elements of the FIG. 1 embodiment following the correction optical system 8 are replaced by a split-image prism 20 and so on. FIG. 7 shows the split-image prism 20 as viewed in the direction of arrows B and B' in FIG. 6. In FIG. 6, the same reference numerals as those used in the FIG. 1 embodiment are assigned to similar or corresponding elements In the present embodiment, a focus detection mark 6 formed on a wafer 4 is imaged upon the split-image prism 20 and is divided thereby, as in the case of the FIG. 1 embodiment, into two with respect to the lengthwise direction of the image of each mark pattern edge P or P'. Each of the lights having been divided by the prism 20 passes through a common imaging lens 21 and, then is imaged again upon a CCD sensor array 22. It will be understood that in this embodiment the focus detection and the focus adjustment for positioning the wafer 4 exactly upon the best-focus position can be made essentially in the same manner as of those made in the foregoing embodiment.

One of the features of the present embodiment is that a CCD photosensor array such as at 22 is used as a light-receiving means. This is effective to make the focus detecting optical system compact. Further, in the present embodiment, it is not necessary to use any eccentric stop in the imaging lens 21. Additionally, it is not a requirement to illuminate the mark by use of two laser beams projected in two different directions. One-direction illumination may be sufficient, in this embodiment.

Although neither a wafer stage for carrying thereon a wafer nor a stage driver for driving such a wafer stage is illustrated in FIG. 6, the apparatus of FIG. 6 is, of course, provided with these components which are similar to those in the FIGS. 1 embodiment. This is also the case with further embodiments of the present invention which will be described later.

Figure 8:
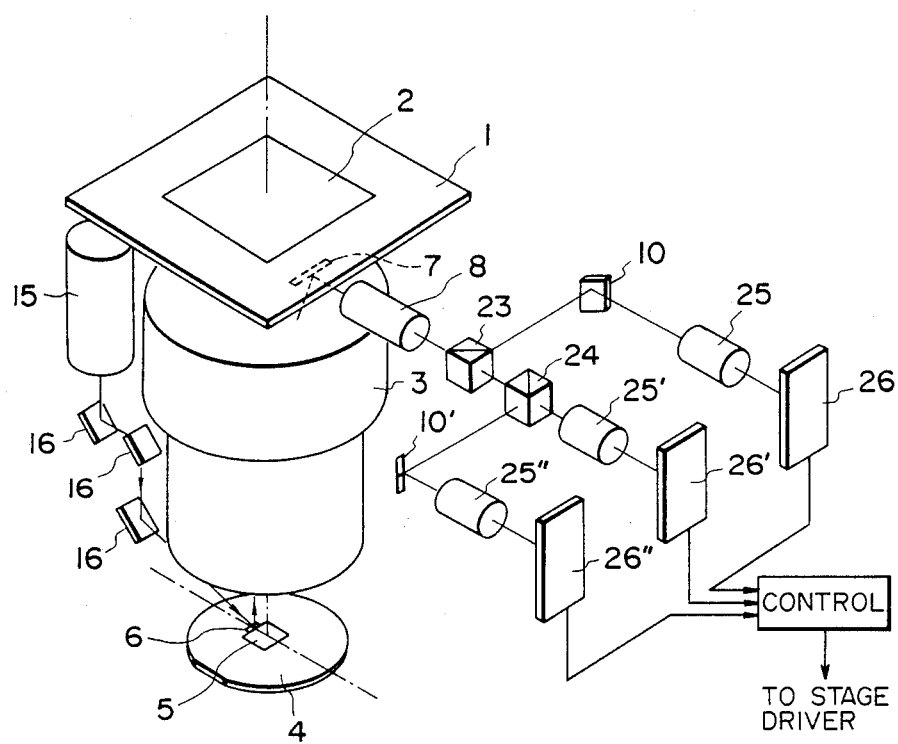
FIG. 8 is a schematic and diagrammatic view of an exposure apparatus into which an autofocusing system according to a third embodiment of the present invention is incorporated.

FIG. 8 shows an autofocusing system according to a further embodiment of the present invention, wherein the focus control is made on the basis of detecting the contrast of the image of a focus detection mark 6. The portion of the autofocusing system of the present embodiment by which portion an aerial image of the mark is formed by the light passed through a correcting optical system 8, may have the same structure as of the corresponding portion of the FIG. 6 embodiment.

The light having formed an aerial image of the mark 6 with the aid of the correcting optical system 8 is divided into three by a combination of beam splitters 23 and 24. Two lights advancing along two of the three paths are reflected by mirrors 10 and 10', respectively. The remaining one is the light passed through the beam splitter 24. These three lights are incident upon imaging optical systems 25, 25' and 25", respectively and, thereafter, they are projected upon CCD sensor arrays 26, 26' and 26".

Of these CCD sensor arrays, the CCD sensor array 26 is disposed so that the image of the mark 6 is imaged thereupon with correct focus when the wafer 4 is at a certain position which is deviated from the best focus position of the projection lens system 3 in the direction toward the projection lens system 3. The CCD sensor array 26' is disposed so that the mark 6 is imaged thereupon with correct focus when the wafer 4 is at the best focus position. The CCD sensor array 26" is disposed so that the mark 6 is imaged thereupon with correct focus when the wafer 4 is at a certain position which is deviated from the best focus position in the direction away from the projection lens system 3.

By the three lights from the three imaging optical systems 25 -25", images of the mark 6 are formed on the three CCD sensor arrays 26 - 26", respectively. Each image of the mark 6 is photoelectrically processed so that it is detected as a signal voltage. Where the sum of the electric voltages as obtainable from those of the picture elements of the CCD sensor upon which the light rays from the mark pattern edges P and P' have impinged is denoted by $\Sigma V_H$ while the sum of the electric voltages as obtainable from those of the picture elements of the CCD sensor array upon which the light rays from the surface portions between the pattern edges P and P' is denoted by $\Sigma V_L$, then the contrast of the image of the mark can be determined as $\Sigma(V_H-V_L)$. Namely, the contrast is highest when the image of the mark 6 formed on a sensor is exactly in focus.

Three CCD sensors are used in this embodiment. This is to allow determination of the direction along which a wafer should be displaced for the focusing purpose and, also, to allow coarse and fine adjustments of the focus adjusting movement. The output signals from these sensors 26 - 26" are applied to a control 100 by way of respective signal lines. In this control 100, the following operations are made.

First, comparison is made with regard to the contrast as determined by the CCD sensor 26 and the contrast as determined by the CCD sensor 26". By this, the direction along which the wafer should be displaced for the focusing can be determined. Subsequently, the stage driver 41 is actuated under the influence of the control 100 so as to displace the wafer 4 in the direction of the optical axis of the projection lens system 3 so that the contrasts as determined by the CCD sensors 26 and 26" becomes substantially equal to each other. This is the coarse focus adjustment. After completion of such coarse focus adjustment, the stage driver 41 is actuated under the influence of the control 100 so as to displace the wafer 4 in the direction of the optical axis of the projection lens system so that the contrast as determined by the CCD sensor 26' becomes maximum. This is the fine focus adjustment by which the wafer 4 can be positioned exactly at the best focus position of the projection lens system 3.

Figure 9:
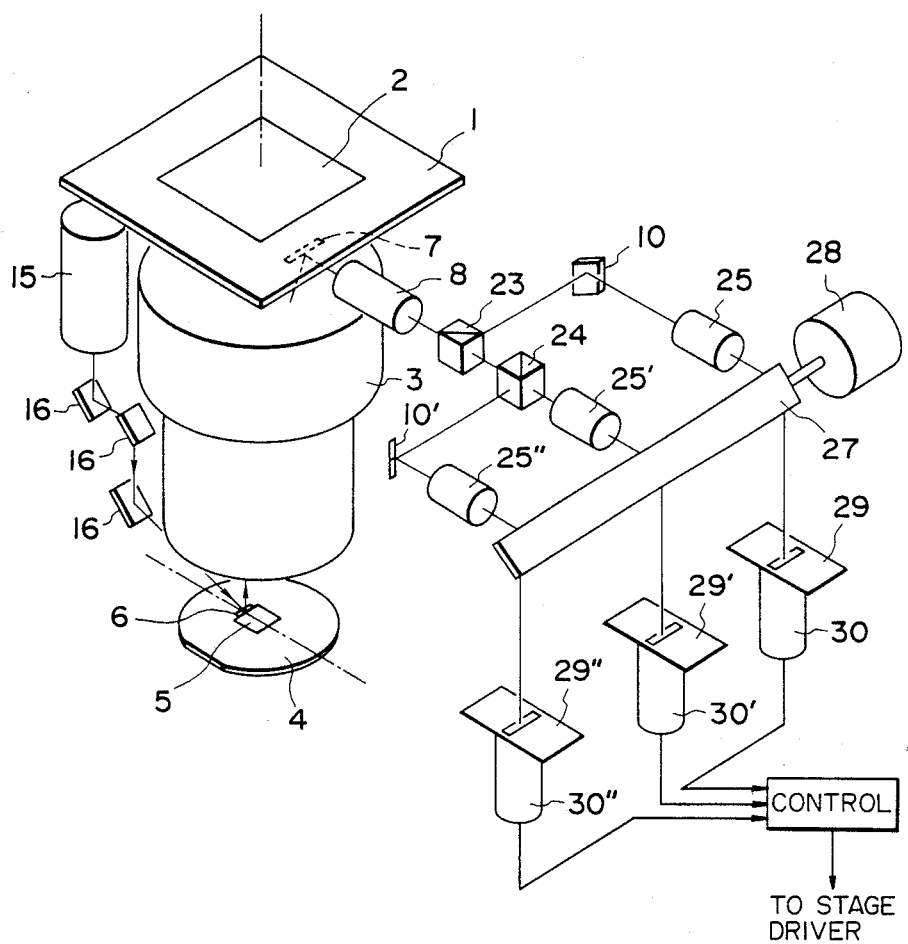
FIG. 9 is a schematic and diagrammatic view of an exposure apparatus into which an autofocusing system according to a fourth embodiment of the present invention is incorporated.

FIG. 9 shows a further embodiment of the present invention, wherein the CCD sensors 26 - 26" in the FIG. 8 embodiment are replaced by three photomultipliers 30, 30' and 30". Like numerals are assigned to like elements, also in this embodiment.

The lights emanating from imaging optical systems 25, 25' and 25" are reflected by a common galvano mirror 27 and, after passing respective slit plates 29, 29' and 29", they are incident upon respective photomultipliers 30 - 30".

Of the three slit plates, the slit plate 29 is disposed at a site upon which a focus detection mark 6 of a wafer is imaged in correct focus when the wafer 4 is at a position which is deviated from the best focus position of the projection lens system 3 in the direction toward the projection lens system. The middle slit plate 29' is disposed at a site upon which the mark 6 is imaged in correct focus when the wafer 4 is exactly at the best focus position of the projection lens system. The slit plate 29" is disposed at a site upon which the mark 6 is imaged in correct focus when the wafer 4 is at a position which is deviated from the best focus position of the projection lens system in the direction away from the projection lens system.

The galvano mirror 27 is moved swingingly by means of a drive motor 28, so that the images being formed by the three lights from the three imaging optical systems 25 -25" are relatively scanned by three slit apertures of the three slit plates 29 - 29", respectively.

Figure 10:
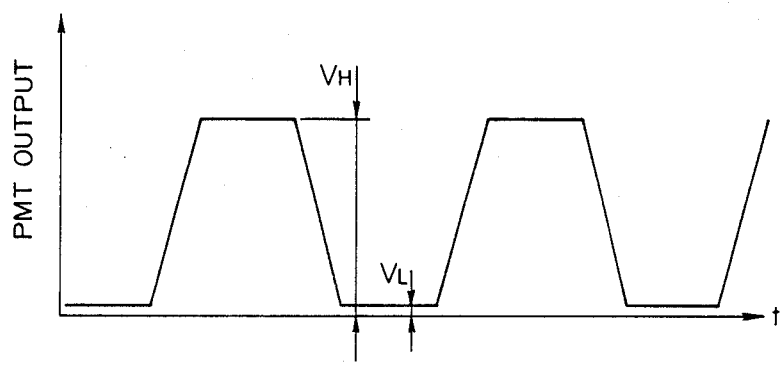
FIG. 10 is a graph showing the output of a photomultiplier, used in the FIG. 9 embodiment, produced by relatively scanning an image of a mark with a slit.

FIG. 10 shows the output variation of one photomultiplier (PMT) when images of pattern edges P and P' are relatively scanned by one slit aperture. As seen in FIG. 10, when the image of such a surface portion of the wafer (or of each mark pattern element) which is between two adjacent edges P and P' scans the slit aperture, the photomultiplier produces a lowest output $V_L$. As the image of an edge P or P' of a mark pattern starts to scan the slit aperture, the output of the photomultiplier starts increasing and, when the image of the edge of the mark is positioned within the slit aperture, the output of the photomultiplier becomes the maximum $V_H$.

The contrast $C_V$ can be determined as:

$$C_V = V_H - V_L.$$

Accordingly, also in the embodiment shown in FIG. 9, the focus control is attainable on the basis of contrast monitoring made essentially in the same manner as of the FIG. 8 embodiment.

Of course, as a possible alternative, the outputs of the photomultipliers 30 - 30" may be differentiated and the focus control may be made by use of signals obtained by the differentiation If to do so is desired, the output signal of each photomultiplier produced in response to scan of the image of a mark pattern edge P or P' by the slit aperture is differentiated. This is repeated while displacing the wafer 4 upwardly and/or downwardly along the optical axis of the projection lens system 3. At the time at which the absolute of the value obtained by the differentiation becomes maximum, the mark 6 is being imaged upon the surface of corresponding slit plate with exact focus. Thus, on the basis of the differentiation of the output signals, the focusing can be controlled essentially in the same way as described before.

In the embodiments shown in FIGS. 8 and 9, no eccentric stop is provided on the pupil plane of each of the imaging lenses 25 - 25". For this reason, it is sufficient for the illumination of the mark 6 to use a single light projected in one direction, as illustrated in these Figures.

Description will now be made to the wavelength of light for use in the illumination of the focus detection mark.

While in the foregoing embodiments the focus detection mark is illuminated by use of light having a wavelength which is different from that of light used for the exposure (photoprinting), this is not a requirement. The same wavelength as of the light used for the exposure may be used, as desired. However, on an occasion where a multilayered photoresist coating or a contrast enhancing layer (CEL) is employed on a wafer, aiming at improving the resolution of the image being projected by a projection optical system, use of light of the same wavelength as of the light for the photoprinting to accomplish the focus control will not assure an improvement of the detection accuracy to such an extent as desired. This is because of substantial absorption of mark detecting light by the multilayer photoresist coating or the contrast enhancing layer.

In order to avoid such an inconvenience, it will be necessary to use, for the mark illumination, a light source that produces a light of a wavelength which is different from the wavelength of the light used for the exposure. However, in this connection, consideration should be made to the following matter.

Usually, a projection optical system is designed so that it shows best optical performances when it is used with a particular wavelength that is used for the exposure of a wafer. Thus, the imaging characteristics of the projection optical system would be deteriorated to a great extent when the projection optical system is used with any other wavelength or wavelengths.

Figure 11:
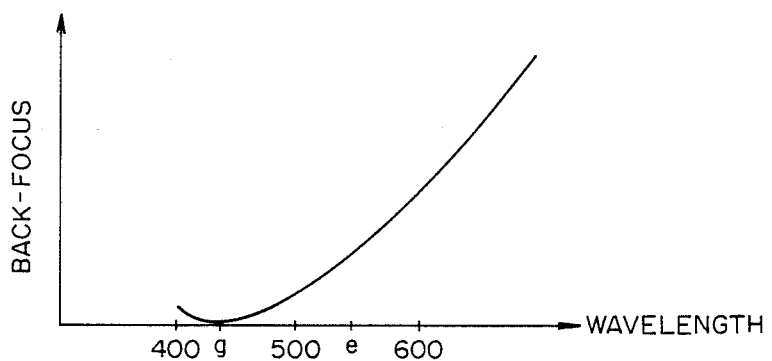
FIG. 11 is a graph showing the relation between wavelength and back-focus.

For example, a projection lens system for use with a light of g-line rays (436 nm in wavelength) is usually designed while paying consideration to the spectral bandwidth of the g-line, such that it shows a wavelength-to-backfocus relation as illustrated in FIGS. 11, wherein the curve contacts the axis of abscissa at the wavelength of the g-line. Accordingly, within the range of the spectral bandwidth of the g-line, the focus shifts by a very small amount with the change in the wavelength. However, in a wavelength region away from the wavelength for the photoprinting, the focus shifts to a great extent with the change in the wavelength. In a case of light of e-line rays (546 nm in wavelength) which can be supplied from an Hg lamp, it has a wide spectrum extension so that the focus can shift by approximately 10 microns at the maximum. Use of such a light, such as the light of e-line, having a wide spectrum extension for the focus control will not attain high-accuracy focusing, as desired.

For the reasons stated above, it is desirable to use, for the focus control, a monochromatic light such as typically a laser beam having a narrow spectral bandwidth. However, use of such a monochromatic light as a laser beam involves a problem.

That is, when a monochromatic light such as a laser beam is projected upon a wafer, there easily occurs interference between the light as reflected by the surface of a photoresist coating of the wafer and the light passed through the photoresist layer and then reflected by the substrate of the wafer.

Particularly, if the wafer substrate has a high reflection factor, a portion of the light reflected from the wafer substrate is again reflected by the interface between the resist layer and the air in which the wafer is placed, such that the said light portion goes back to the wafer substrate and is reflected thereby again. In this manner, the light is multireflected within the wafer. The multireflection of light described above finally results in the interference that causes enormous changes in the amplitude (intensity) of the focus detecting light or unbalanced amplitude distribution of the focus detecting light. As a result, the focus detecting accuracy is degraded.

In consideration of this, in the embodiments described in the foregoing, the angle of incidence of each laser beam projected upon a wafer is specified as described so as to prevent the light reflected by the resist surface from entering into the projection optical system. This effectively minimizes the above-described undesirable effect of interference resulting from the existence of a photoresist coating in a case where a monochromatic light is used. Further, this allows use of a high-luminance laser with an advantageous result that higher intensity of scattered lights are obtainable from a mark on a wafer and, therefore, the sensitivity for the mark image detection can be improved significantly.

The manner of illumination of a mark described with reference to the foregoing embodiments is effectively applicable to illuminate an alignment mark in an automatic wafer alignment system. An example of such an alignment system using a similar mark illumination system is disclosed in Japanese Laid-Open Patent Application, Laid-Open No. Sho 62-291919.

It is easy to modify the exposure apparatuses of the foregoing embodiments to provide them with both the autofocusing function and the automatic alignment function For example, in the embodiments described with reference to FIGS. 8 and 9, the output signal obtainable from the middle CCD sensor array 29' or the middle photomultiplier 30' of the plural light receiving devices (although it is not always necessary to use such a middle sensor) which are provided in the focus control system based on the contrast detection, may be easily used for the automatic alignment of the wafer. If to do so is desired, then, for example, a transparent plate having a suitable reference mark may be disposed at a site whereat an image of the mark 6 is formed by the correcting optical system (FIGS. 8 or 9). Alternatively, a certain reference may be defined on the light receiving surface of each CCD sensor. As a further alternative, the drive signal for the galvano mirror may be used as a reference signal. In any case, any positional deviation of the detected mark from a reference position which is predetermined can be detected easily.

In the autofocusing system of the FIG. 1 embodiment which relies upon the detection of relative positional deviation of the formed images, a slight modification will allow use of the mark signal for the wafer alignment purpose. For example, the eccentric stop provided in the imaging lens 11 may be arranged retractable so that it can be retracted at the time of the alignment operation. By doing so, the output signal obtainable from the photomultiplier 15 may be used as an alignment signal for the automatic wafer alignment purpose.

In these cases, each mark on a wafer may be used both as a focus detection mark and an alignment mark. Of course, each wafer may have focus detection marks and alignment marks, separately.

It will be understood from the foregoing description that the present invention effectively assures accurate detection of the position of the surface of a wafer substantially without the effect of a photoresist surface layer provided thereon and substantially independently of the surface conditions. Thus, the present invention allows accurate autofocusing for various types of wafers having many varieties of surface conditions.

In one aspect, the present invention uses a mark formed on an article such as a wafer. An image of the mark is formed at certain position by use of a projection optical system and, on the basis of the state of the thus formed image, the positional relation between the article and an imaging plane of the projection optical system with respect to the optical axis of the projection optical system is detected. Thus, the present invention attains high-accuracy focus detection wherein any shift of the focus position of the projection optical system is directly monitored. Therefore, the article can be positioned exactly on the imaging plane of the projection optical system.

In another aspect, the present invention allows accurate detection of the positional relation between an imaging plane of a projection optical system and an article having a transparent surface layer, such as a semiconductor wafer having a photoresist coating. For this purpose, the present invention uses a light such as a laser beam which is projected upon a mark on the article in a specific direction and not by way of the projection optical system, so as to substantially completely prevent the light reflected by the surface of the transparent surface layer of the article from entering into the projection optical system and also to assure that the light scatteringly or diffractively reflected by the mark can be selectively and efficiently received by the projection optical system. Thus, the mark of the article can be imaged very sharply with a good signal-to-noise ratio. Namely, the undesirable effect of the transparent surface layer such as the photoresist coating can be avoided sufficiently.

While the invention has been described with reference to the structures disclosed herein, it is not confined to the details set forth and this application is intended to cover such modifications or changes as may come within the purposes of the improvements or the scope of the following claims.

What is claimed is:

1. An autofocusing system usable in a projection exposure apparatus having a projection optical system for projecting a pattern of a first object upon a second object having a light sensitive surface layer, said apparatus comprising:

illumination means for illuminating a predetermined pattern of the second object without use of the projection optical system and by use of a light, in a direction which is inclined by a predetermined angle with respect to an optical axis of the projection optical system;

an optical system for receiving light reflectively scattered by said predetermined pattern and passed through the projection optical system, said optical system forming an image of said predetermined pattern by use of the received light;

light receiving means for photoelectrically converting the image of said predetermined pattern and for producing a signal corresponding to the state of the image of said predetermined pattern; and adjusting means for adjusting the positional relation between an imaging plane of the projection optical system and the second object with respect to the direction of the optical axis of the projection optical system, such that an imaging light from the projection optical system can be focused upon the second object.

2. An apparatus according to claim 1, wherein said illumination means includes a laser adapted to supply a laser light having a wavelength which is different from that of the imaging light from the projection optical system.

3. An apparatus according to claim 1, wherein said illumination means is arranged to illuminate said predetermined pattern of the second object in two different directions 4. An apparatus according to claim 2, wherein said optical system includes an aberration correcting optical arrangement effective to correct any chromatic aberration which may be caused by the projection optical system in relation to the laser light from said laser.

5. A method, usable in a projection exposure apparatus having a projection optical system for projecting a pattern of a first object upon a second object having a light sensitive layer, for accurately positioning the second object with respect to an imaging plane of the projection optical system, said method comprising the steps of:

providing a mark pattern on the second object;

illuminating said mark pattern on the second object without use of the projection optical system and by use of light in a direction inclined by a predetermined angle with respect to an optical axis of the projection optical system;

receiving the light reflectively scattered by said mark pattern, by use of the projection optical system and forming, on a predetermined image plane, an image of said mark pattern by use of the received light; and moving the second object in the direction of an optical axis of the projection optical system in accordance with the state of the image of said mark pattern, such that the second object is positioned upon the imaging plane of hte projection optical system.

6. A method according to claim 5, wherein said mark pattern comprises a linear pattern elongated in a direction and wherein said mark pattern is illuminated in a direction perpendicular to the direction of elongation of said linear pattern.

7. A method according to claim 5, wherein said illumination step includes a first substep for illuminating said mark pattern in a first direction and a second substep for illuminating said mark pattern in a second direction different from the first direction.

8. A method according to claim 5, wherein, in said image forming step, the light scattered by an edge of said mark pattern is selectively extracted so that an image of the edge of said mark pattern is formed by use of the extracted light.

9. A method according to claim 5, wherein said illumination step includes:

providing a laser adapted to supply a light of a wavelength different from that of light used for the projection exposure; and irradiating said mark pattern with the light from the laser, not by way of the projection optical system and in a direction which is inclined by a predetermined angle with respect to the direction of the optical axis of the projection optical system.

10. A method according to claim 9, wherein said image forming step includes:

selectively applying, to the projection optical system, the light scattered by said mark pattern;

directing the light passed through the projection optical system to a chromatic aberration correcting arrangement; and forming the image of said mark pattern by use of the chromatic aberration correcting arrangement.

11. A method, usable in a projection optical system form projecting a pattern of a first object upon a second object having a radiation sensitive surface layer, for positioning the surface of the second object with respect to an imaging plane of the projection optical system, said method comprising the steps of:

illuminating the surface of the second object without use of the projection optical system, in a direction inclined by a predetermined angle with respect to an optical axis of the projection optical system;

forming a dark field image of the illuminated second object on a predetermined image plane by use of the projection optical system; and adjusting the interval between the imaging plane of the projection optical system and the surface of the second object with respect to the direction of an optical axis of the projection optical system, on the basis of the state of the image of the second object, such that the surface of the second object is positioned on the imaging plane of the projection optical system.

12. A projection exposure apparatus for projecting a pattern of an original on a workpiece having a light sensitive surface layer through a projecting optical system, said apparatus comprising:

a stage for carrying thereon a workpiece having a pattern formed thereon;

illuminating means for illuminating, without using the projection optical system, the pattern of the workpiece by use of light in a direction inclined with respect to an optical axis of the projection optical system;

detecting means for detecting an image of the pattern of the workpiece, formed through the projection optical system by light reflectively scattered by the pattern of the workpiece as illuminated by said illuminating means; and adjusting means responsive to a signal from said detecting means, for focusing an image of the pattern of the original as formed through the projection optical system on the workpiece.

13. An apparatus according to claim 12, wherein said adjusting means comprises driving means for displacing and focusing said stage in the direction of the optical axis of the projection optical system.

14. An apparatus according to claim 12, wherein said detecting means is adapted to detect contrast of the image of the pattern and to produce a signal related to the detected contrast.

15. An apparatus according to claim 12, wherein said detecting means comprises an imaging optical system for refocusing the image of the pattern as formed through the projection optical system on a predetermined image surface, and photoelectirc converting means for photoelectrically converting the refocused image.

16. An apparatus according to claim 15, wherein said imaging optical system is arranged to form first and second refocused images on first and second image surfaces spaced from each other, wherein said photoelectric converting means includes first photoelectric converting means for photoelectrically converting the refocused image as formed on the first image surface and second photoelectric converting means for photoelectrically converting the refocused image as formed on the second image surface, and wherein said detecting means is arranged such that, when the image of the pattern of the original is refocused with respect to the workpiece, said first and second photoelectric converting means produce different signals.

17. An apparatus according to claim 15, wherein said illuminating means illuminates the pattern of the workpiece with light having a wavelength different from that of light used for projection of the pattern of the original, and wherein said detecting means further comprises a corrective optical system disposed between the projection optical system and said imaging optical system and being adapted to correct chromatic aberration of the projection optical system with respect to the formation of the image of the pattern.

18. An apparatus according to claim 17, wherein said detecting means further comprises a mirror disposed between the original and the projection optical system, for reflecting the scattered light from the projection optical system towards said corrective optical system.

19. An apparatus according to claim 12, wherein said illuminating means comprises a plurality of lasers, providing laser beams for illumination of the pattern of the workpiece.

20. An apparatus according to claim 19, wherein the pattern of the workpiece is illuminated with the laser beams coming from the opposite sides of the projection optical system.

21. An apparatus according to claim 12, wherein said illuminating means includes a laser, providing a laser beam having a wavelength different from that of light used for projection of the pattern of the original, and wherein the pattern of the workpiece is illuminated with the laser beam.

22. An apparatus according to claim 12, wherein said illuminating means illuminates the pattern of the workpiece with a laser beam and wherein, when a numerical aperture of the projection optical system is denoted by NA and an angle of incidence of the laser beam with respect to the workpiece is denoted by B, the following relationship is satisfied:

$$sin^{-1}NA + 10° \leq B.$$

23. A method of adjusting a positional relationship between an image plane of a projection system and a surface of an object with respect to an optical axis of the projection system, wherein the object has a pattern formed thereon and is covered by a radiation sensitive layer, said method comprising the steps of:

irradiating the object with a radiation beam such that the projection optical system receives substantially all of the radiation beam reflectively scattered by the pattern of the object, but receives substantially no beam reflected by the surface of the sensitive layer;

forming an image of the pattern of the illuminated object by use of the projection system the reflectively scattered component of the beam; and adjusting the positional relationship between the image plane of the projection system and the surface of the object on the basis of the image formed.

24. A method according to claim 23, wherein the step of irradiating the object comprises projecting a laser beam to the object in a direction inclined by a predetermined angle with respect to the optical axis of the projection system, but not through the projection system.

25. An exposure apparatus having a projection system through which an exposure energy beam is focused on an object covered by an exposure energy sensitive layer and having a predetermined pattern thereon, such that a predetermined circuit pattern is printed on the object by the exposure of the sensitive layer with the exposure energy beam, the improvement comprising:

irradiating means for irradiating the object with a radiation beam in a direction inclined by a predetermined angle with respect to an optical axis of the projection system, but not through the projection system and wherein the angle is predetermined such that the projection system receives substantially all of the radiation beam reflectively scattered by the predetermined pattern of the object, but receives substantially no beam reflected by the surface of the photosensitive layer;

converting means for converting an image of the predetermined pattern of the object as formed by the reflectively scattered component of the radiation beam received by the projection system into a signal; and positioning means for relatively positioning a plane of focus of the exposure energy and the surface of the object in a predetermined positional relationship in response to the signal from said converting means.

26. An apparatus according to claim 25, wherein said irradiating means comprises means for providing a laser beam as the radiation beam having a wavelength different from that of the exposure energy beam.

27. An apparatus according to claim 26, wherein a relationship $\sin^{-1}NA + 10° \leq B$ is satisfied, wherein NA is the numerical aperture of the projection system and B is the predetermined angle.

28. A method of detecting displacement between an image plane of a projection system and the surface of an object with respect to an optical axis of the projection system, wherein the object has a predetermined pattern formed thereon and a radiation sensitive layer covering it, said method comprising the steps of:

irradiating the object with a radiation beam such that the projection system receives substantially all of the beam reflectively scattered by the predetermined pattern of the object, but receives substantially no beam reflected by the surface of the sensitive layer;

forming an image of the predetermined pattern of the irradiated object by use of the projection system and the reflectively scattered component of the beam of the projection system; and detecting displacement between the image plane of the projection system and the surface of the object on the basis of the image of the pattern formed.

29. A method according to claim 28, wherein the step of irradiating the object comprises projecting a laser beam to the object in a direction inclined by a predetermined angle with respect to the optical axis of the projection system, but not through the projection system.

30. A method according to claim 29, wherein a relationship $\sin^{-1}NA + 10° \leq B$ is satisfied, where NA is the numerical aperture of the projection system and B is the predetermined angle.

* * * * *

UNITED STATES PATENT AND TRADEMARK OFFICE
CERTIFICATE OF CORRECTION

PATENT NO. : 4,952,970

DATED : August 28, 1990

INVENTOR(S) : Akiyoshi Suzuki, et al.

It is certified that error appears in the above-identified patent and that said Letters Patent is hereby corrected as shown below:

ON THE TITLE PAGE:

U.S. PATENT DOCUMENTS

"Imahasi" should read --Imahashi--.

IN THE DISCLOSURE

COLUMN 1

Line 30, "in" should read --with--.

COLUMN 2

Line 16, "within" should read --with--.

COLUMN 4

Line 21, "form" should read --from--; and
Line 38, "prevent" should read --ensure--.

COLUMN 5

Line 31, "or" should be deleted.

UNITED STATES PATENT AND TRADEMARK OFFICE
CERTIFICATE OF CORRECTION

PATENT NO. : 4,952,970

DATED : August 28, 1990

INVENTOR(S) : Akiyoshi Suzuki, et al.

It is certified that error appears in the above-identified patent and that said Letters Patent is hereby corrected as shown below:

COLUMN 7

Line 42, "arrows A and A" should read --arrows A and A'--; and

Line 68, "edges" should read --edges.--.

COLUMN 9

Line 18, "applications" should read --application.--.

COLUMN 11

Line 39, "becomes" should read --become--.

COLUMN 12

Line 35, "differentiation" should read --differentiation.--.

COLUMN 14

Line 15, "function" should read --function.--.

COLUMN 15

Line 63, "directions" should read --directions.--.

UNITED STATES PATENT AND TRADEMARK OFFICE
CERTIFICATE OF CORRECTION

PATENT NO. : 4,952,970

DATED : August 28, 1990

INVENTOR(S) : Akiyoshi Suzuki, et al.

It is certified that error appears in the above-identified patent and that said Letters Patent is hereby corrected as shown below:

COLUMN 16

Line 23, "hte" should read --the--; and
Line 60, "form" should read --for--.

COLUMN 17

Line 44, "photoelectirc" should read --photoelectric--.

COLUMN 20

Line 22, "$\sin^{31}{}^{1}NA+10° \leq B$" should read --$\sin^{-1} NA+10° \leq B$--.

Signed and Sealed this

Twenty-eighth Day of July, 1992

*Attest:*

DOUGLAS B. COMER

*Attesting Officer*      *Acting Commissioner of Patents and Trademarks*